United States Patent [19]

Howell et al.

[11] 4,151,510
[45] Apr. 24, 1979

[54] METHOD AND APPARATUS FOR AN EFFICIENT ERROR DETECTION AND CORRECTION SYSTEM

[75] Inventors: Thomas H. Howell, Scottsdale; Robert E. Scriver; Joseph C. Circello, both of Phoenix, all of Ariz.

[73] Assignee: Honeywell Information Systems, Phoenix, Ariz.

[21] Appl. No.: 900,627

[22] Filed: Apr. 27, 1978

[51] Int. Cl.$^2$ ............................................. G06F 11/12
[52] U.S. Cl. .................. 340/146.1 AL; 340/146.1 AV
[58] Field of Search ........... 340/146.1 AL, 146.1 AV; 235/303.2

[56] References Cited

U.S. PATENT DOCUMENTS

| | | | |
|---|---|---|---|
| 3,801,955 | 4/1974 | Howell | 340/146.1 AL |
| 3,859,630 | 1/1975 | Bennett | 340/146.1 AL |
| 4,030,067 | 6/1977 | Howell et al. | 340/146.1 AL |
| 4,117,458 | 9/1978 | Burghard et al. | 340/146.1 AL |

Primary Examiner—David H. Malzahn
Attorney, Agent, or Firm—William W. Holloway, Jr.; R. T. Reiling; N. Prasinos

[57] ABSTRACT

In an information handling system in which a cyclic code is utilized to both detect and correct errors and a cyclical redundancy code is used for supplementary detection of errors, the cyclical redundancy code (CRC) polynomial is chosen to be a factor of the generator polynomial, g(x), of the error detection and correction (EDAC) code. In this way, the same check bits in the code word used for error detection and correction may be further utilized for a CRC check to supplement the error detection capabilities of the system. The risk of miscorrection of data is reduced to de minimus levels by the partitioning of data and count fields in the course of the development of the error detection and correction codes. Practice of the teachings herein disclosed provides a more efficient error detection and correction system with greatly reduced risk of miscorrection. An embodiment of the invention is disclosed following the methodology taught herein.

10 Claims, 6 Drawing Figures

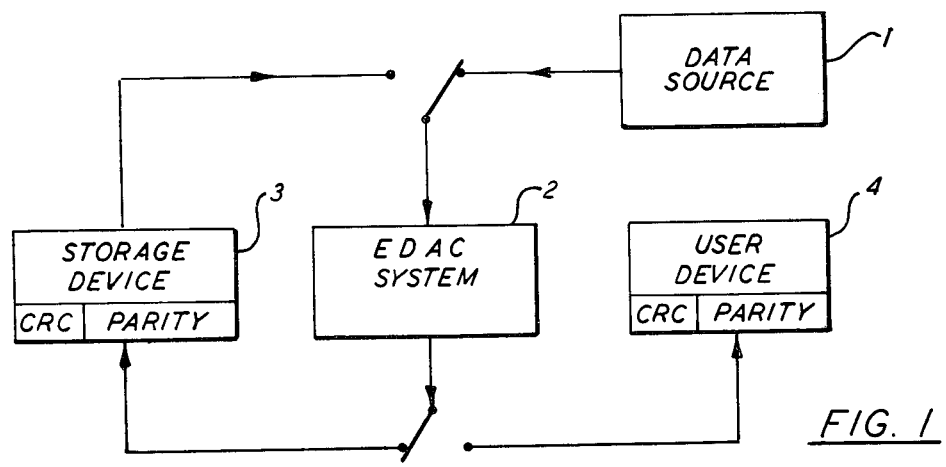
FIG. 1
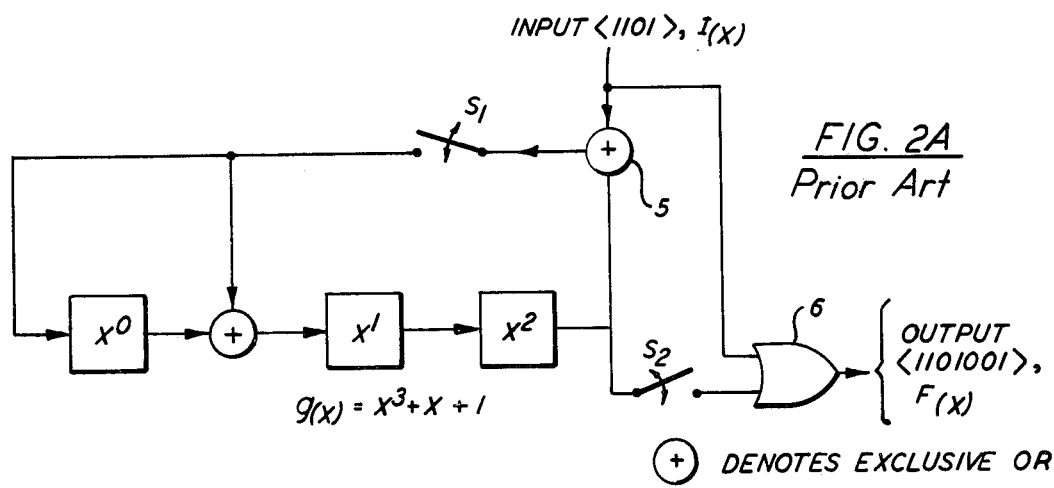
FIG. 2A
Prior Art
FIG. 2B

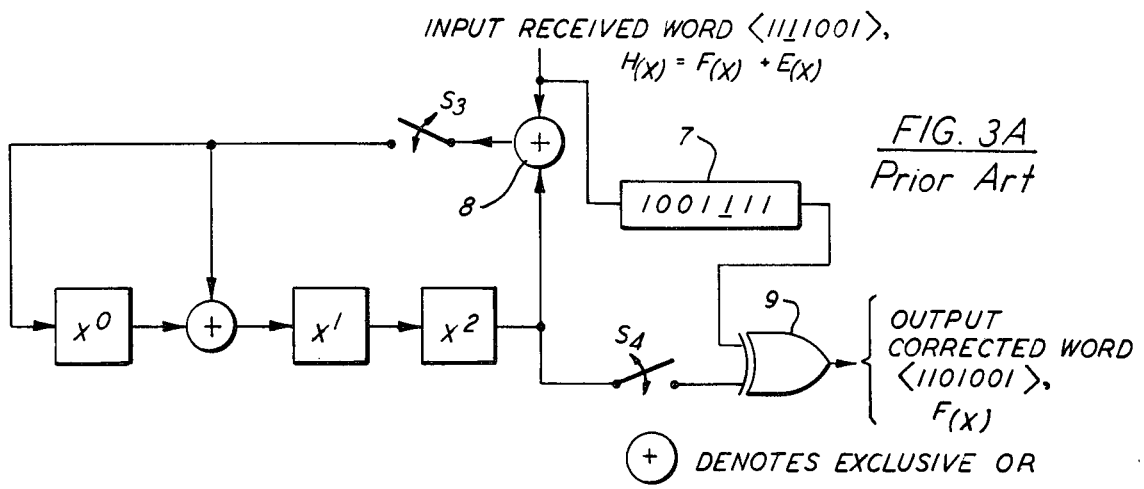

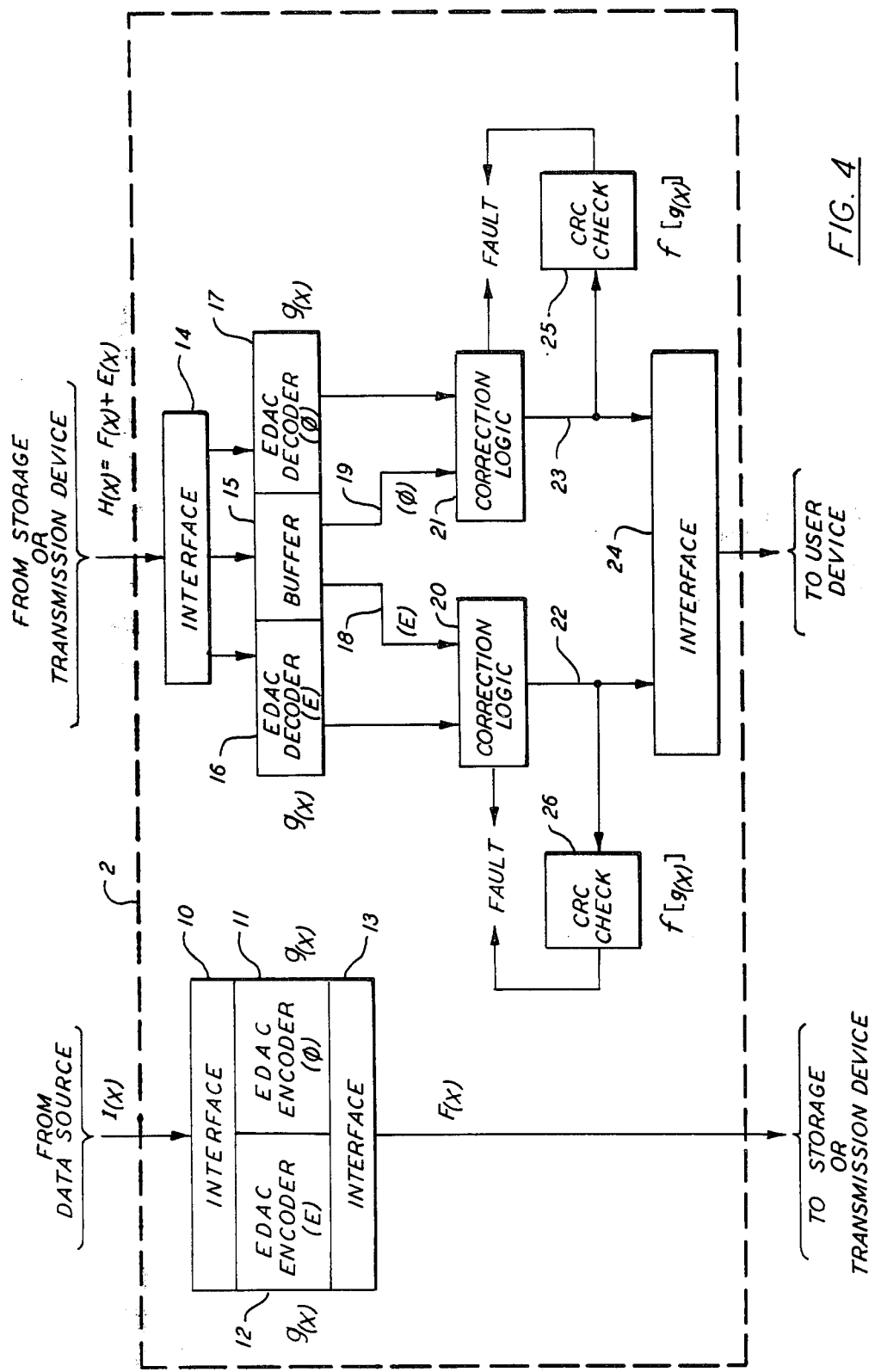

METHOD AND APPARATUS FOR AN EFFICIENT ERROR DETECTION AND CORRECTION SYSTEM

BACKGROUND

1. Field of the Invention

The invention relates to the field of error detection and correction in information handling systems. In particular, the invention relates to the reduction of miscorrections in error detection and correction schemes used in digital information systems and employs Fire codes verified by cyclical redundancy coding.

2. Prior Art

The concept of communication, in general, implies that the receiver of information derive the same meaning therefrom as the sender had when he transmitted his message. Achieving communication vis-a-vis individuals is itself often a difficult task. When communication is by way of radio transmission, long line transmission, or even the short distance spanned by an interface device between two pieces of electronic equipment, the communication problem is often complicated by the presence of noise.

The ability to communicate is enhanced when the information is transmitted by means of binary code. Such a code typically consists of two energy states, a high level and a low level state, often referred to as logical states "1" and "0" respectively. Here again, however, noise or equipment faults may cause the receipt of a 1 or a 0 when a 0 or a 1 has been transmitted.

A binary coded word or number will consist of a grouping of 1's and 0's. For example, the code grouping 101 may be taken to represent the quantity five. If an error is introduced in transmission, the code group may be received as the binary code 100, that is, the quantity four. The code group 101 is said to comprise a 3-bit word.

One of the earliest techniques of error detection consisted of the addition of an extra bit to the word transmitted for the sole purpose of checking the received word to determine whether there had been an error in transmission. A bit added to a word to provide such an error check is hereinafter referred to as a check bit. The early technique referred to was known as a parity check. By parity, it was meant that all words transmitted contained an equal number of 1's. In the case referred to as "even parity", all transmitted words contain an even number of 1's. Odd parity implies that all transmitted words contain an odd number of 1's. Thus, the quantity five, in even parity, would be transmitted as 1010, the right-most 0 being the parity check bit. If an error in transmission resulted in the receipt of the word 1000, the parity check would indicate an odd number of 1's and cause a request to b made for the retransmission of the data, it having been recognized that an error existed because the received word lacked even parity. The application of odd parity checks should be apparent to the reader.

While parity checks provide a convenient means for detecting an error in a single bit, the check fails if two bits should be in error. Thus, if the word 1010 is transmitted and the word 0110 is received, the parity check bit will pass the erroneous word with the error undetected. Because of the limitations of the parity check, other, more involved, checking techniques were derived.

The combination of information bits plus check bits is known as a code word. The code word is generated in accordance with a selected polynomial, the polynomial being selected for its ability to meet or exceed the error detection design criterion of the system a characteristic inherent in certain codes provides the descriptor for all such codes. Cyclic Codes. A code is said to be cyclic if any code word, when cycled in either direction, any number of positions, remains a code word of the same code. A code word cycled once implies that the first bit becomes the last bit in the code word and what was originally the second bit becomes the first bit of the new code word. Cycling in the other direction implies that the last bit becomes the first bit in the code word and the next to last bit of the original code word becomes the last bit of the new code word. Because all cyclic codes are linear the sum of two code words results in a code word within the same code.

Cyclic codes were an improvement on the parity check in that multiple-bit errors could now be detected. However, for all practical purposes, cyclic codes, like parity codes, lend themselves merely to the detection of errors in the received information. When an error is detected in the information received, it is necessary that the sender be notified and a retransmission be initiated. To preclude the necessity of retransmitting the data, a self-correcting error detection code was desired.

One of the earlier workers in the field to expound a practical methodology for deriving codes capable of both detecting and correcting errors was R. W. Hamming. (See Hamming, "Error Detecting and Error Correcting Codes" *Bell System Tech. J.*, Vol. 29, 1950, pp. 147–160.) The application of Hamming's work permitted the detection and the correction of randomly occurring errors within a single bit of a received code word. The names of Bose, Ray-Chaudhuri and Hocquenghem became associated with error detecting and correcting codes capable of detecting and correcting errors occurring within multiple bits of a transmitted word. Such codes are familiarly referred to as BCH codes. The designer of an error detection and correction (EDAC) system may choose to use Hamming or BCH codes because of the random nature of the errors encountered and the likelihood that such errors will affect one or more than one bit in any given code word. However, there are other circumstances in which a burst of noise may be expected to adversely affect several bits within a given bit-length. Burst errors are frequently associated with surface defects in disk memories or tape storage devices. So too, atmospheric transmission of data or long-line transfers are subject to noise problems leading to burst errors in the information received. Phillip Fire disclosed the family of cyclic codes which bear his name, and which provide a simple-to-implement burst error detection and correction system. The use of Hamming, BCH, or Fire codes permitted the designer of EDAC systems with the means of correcting errors as they were received and obviated the need to retransmit the information. A significant problem still remained however, the miscorrection of received data.

In general, all of the codes mentioned allow the designer the choice of accurately detecting a greater number of bit errors than the system is capable of correcting. Thus, when the number of bits in error in a code word exceeds the maximum number which are correctable with the code employed, the errors will not be automatically corrected; and, if the number of errors are within the accurate detection capability of the system, a retransmission of the data will be required. However, if the number of errors exceeds the limits of accurate detection, the possibility exists that the system will cause a miscorrection to be made in the received data. With a miscorrection, the tansmitted authorization to pay $100 might have been erroneously received as authority to pay $10,000 and miscorrected to cause the issuance of a $1,000,000 check. As may be readily imagined, such miscorrections may themselves generate a considerable amount of "noise" among managerial staff members.

It is typical of past practice to select a Hamming, BCH, or Fire Code as the main error detection and correction code of the system; to provide each code word with an additional check bit as a parity check to detect errors in the received word; and to select a secondary ∓Cyclic Redundancy Code (CRC)" to provide enhanced error detection capabilities.

It is seen that the addition of EDAC check bits, cyclic redundancy code check bits, and parity check bits to a given information word directly affect its length and therefore have a direct bearing upon system capabilities. Thus, the length of a code word may determine the speed with which information may be transmitted, and may be determinative of the amount of information which may be stored within a given storage medium. The problem of avoiding a miscorrection has generally been approached by selecting EDAC codes having capabilities of detecting errors beyond the realm of those which are statistically probable in any given system. Enhancing the error detection capabilities of a given system by the selection of a more complex code polynominal tends to increase the complexity of the EDAC encoder and decoder circuitry and to inefficiently increase the length of the code word.

The present invention therefore has as its object the improved efficiency in the utilization of code words used to provide error detection and correction and supplementary detection capabilities. A further object of the invention is to provide a methodology for designing EDAC systems which reduce the probability of making miscorrections to a de minimus level.

SUMMARY OF THE INVENTION

In an information handling system in which a cyclic code is utilized to both detect and correct errors and a cyclical redundancy code is used for supplementary detection of errors, the cyclical redundancy code (CRC) polynominal is chosen to be a factor of the generator polynominal, $g(x)$, of the error detection and correction (EDAC) code. In this way, the same check bits in the code word used for error detection and correction may be further utilized for a CRC check to supplement the error detection capabilities of the system. The risk of miscorrection of data is reduced to de minimus levels by the partitioning of data and count fields in the course of the development of the error detection and correction codes. Practice of the teachings herein disclosed provides a more efficient error detection and correction system with greatly reduced risk of miscorrection.

BRIEF DESCRIPTION OF THE DRAWINGS

FIG. 1 is a block diagram showing an EDAC system in a typical operating environment.

FIGS. 2A and 2B illustrate a prior art EDAC encoder.

FIGS. 3A and 3B show a prior art EDAC decoder.

FIG. 4 illustrates an embodiment of an EDAC system in accordance with the methodology taught by the invention.

DESCRIPTION OF THE INVENTION

An error detection and correction system may be employed as illustrated in FIG. 1. Information from a data source 1 s fed to an EDAC system 2 which in accordance with a selected code generator polynominal, $g(x)$, complements the incoming data by the addition of coded check bits which may later be decoded to determine whether an error has crept into the data.

From the EDAC system, the coded data may be output directly to a user device or provide the input to a storage or transmission device. In either case, the device to which the data is input may provide for error detection. This may assume either or both parity check and a check against a cyclic redundancy code. If an error is detected at this time, a request for retransmission of the data would be made.

If the data has been placed in a storage device such as indicated by 3, retrieval of the data will be via the same EDAC system which provided the original coding, or a similar system utilizing the same generator polynominal, $g(x)$, as the original coding system used. In passing through the EDAC system, the output of the stored data will be checked to confirm that no errors have been incorporated into the data as a result of defects within the storage device or noise in transiting the interface between the storage device 3 and the EDAC system 2. If an error is detected within the EDAC system 2, it will be corrected therein and the corrected data output to a user device such as indicated by 4 in FIG 1. To detect the presence of errors introduced in traversing the interface between the EDAC system and the user device a CRC and a parity check may be performed and a request for a retransmission of the data made if an error is detected.

An encoder for generating code check bits in accordance with the polynominal $g(x) = X^3 + X + 1$, is illustrated in FIG. 2a. This hardware embodiment of a cyclic code generator utilizes a linear feedback shift register. Reference may be made to W. W. Peterson, *Erro Correcting Codes*, Cambridge, Mass.; MIT Press, 1961, at pp. 107 through 123 for a general discussion of linear feedback shift register circuitry. Since cyclic code encoders and decoders are well known in the prior art, the discussion of them, as illustrated in FIGS. 2 and 3 respectively, will be somewhat cursory, being set out here primarily to place the invention in context.

In general, an encoder or decoder for use with a cyclic code will use linear feedback shift registers comprised of a number of flip flops, as determined by the degree of the code generator polynomial employed, and will contain feedback paths to those flip flops corresponding to the terms of the selected code polynomial. Thus, for the generator polynomial, $g(x)$, selected to illustrate FIGS. 2 and 3, the linear feedback shift register is comprised of three flip flops, since the polynomial, $g(x)$, is of degree three. Feedback through Exclusive OR circuits is shown to flip flops corresponding to the terms $X^1$ and $X^0$ in the polynominal $g(x)$.

Referring specifically to the encoder of FIG. 2A, the information word, $I(x)$, comprising information sequence 1101, is input to the encoder through Exclusive OR 5 and is simultaneously fed to OR gate 6. While the code checkbits are being generated, switch S1 and is in the closed position and switch S2 is open. The information word I(x) is thus being output through OR gate 6 at the same time that the encoder check bits are being generated. The table of FIG. 2B illustrates, step by step, the sequencing of the linear feedback shift register flip flops $X^0$, $X^1$, and $X^2$ as the information sequence flows through the encoder.

As the last bit of information enters the encoder through OR gate 5 and switch S1, the register contents are as illustrated in the bottom line of FIG. 2B. The code check bits thus indicated are 001. At this time switch S1 is opened and switch S2 is closed. The contents of the linear feedback shift register is then clocked out through switch S2 and OR gate 6, to join the information stream I(x) at the output, to form code word F(x). The code word, F(x), contains both the information sequence, 1101, and the check bit sequence, 001, all as indicated in FIG. 2A.

A decoder for use with code words generated by the encoder of FIG. 2A is illustrated in FIG. 3A. As may be seen, the hardware implementation of a decoder is essentially the same as that of the encoder with the addition of buffer register 7. It takes but little thought to realize that the same hardware may be implemented and utilized for both encoding and decoding within a given EDAC system. In practice, such implementation is frequently employed. To illustrate the function of the decoder and of its error correcting capabilities, it is here assumed that the code word F(x) was transmitted, but the word received at the input to the decoder is the word H(x), comprised of the code word F(x) and an error E(x). Specifically it is assumed that the code word transmitted was 1101001 and the word received 1111001.

The received word is input to buffer register 7 and simultaneously through OR gate 8 to the decoder. FIG. 3B illustrates the step by step sequencing of the linear feedback shift register flip flops. As the least significant bit of the received word enters the decoder, the decoder contents, 001, are denoted as the "Error Syndrome". This implies that an error is present in the received word. Were the error syndrome to be all zeroes, that is: 000, the implication would be that there was no error contained within the word received. Since the error syndrome is not all zero, the EDAC system will go into its error correction mode.

Coincident with the derivation of the error syndrome, the received word H(x) has been stored in buffer register 7. Upon recognition of a non-zero syndrome, a sequence of logical 0 inputs is injected into the decoder input. With each zero input of the correction process, one bit of the word stored within buffer register 7 is gated out. Each time a zero is input, the contents of the flip flops are also checked until all but the most significant bit is zero. At that time switch S3 is opened and switch S4 is closed. The contents of buffer register 7 and the linear feedback shift register, comprised of the three flip flops $X^0$, $X^1$, and $X^2$, are simultaneously gated out to Exclusive OR gate 9. The output of OR gate 9 is the corrected code word, F(x). This sequence is shown, step by step, in the lower portion of the table illustrated in FIG. 3B. The Peterson text, noted earlier herein, may be referred to for more detailed background in the operation of linear feedback shifted registers for encoding, checking and error correction purposes.

The present invention makes use of encoder and decoder circuitry well known in the prior art, but utilizes them in a manner which provides benefits not previously realized in older EDAC systems. in the embodiment chosen for exposition of the methodology taught herein, the requirement to correct burst errors of length four and to detect without miscorrection 100% of the errors of length sixteen or less, will be assumed. A burst-error detection-and-correction system is concerned with errors which occur within any given length span of bits within a code word. For example, if the EDAC system is designed around a sixteen-bit-length burst error, it will detect errors in one or more bits within a span of sixteen bits. The bits in error need not be consecutive bits, i.e., the first and last bit may be in error within any given span of sixteen bits, while those bits in between the erroneous bits may or may not be correct.

Burst errors are usually associated with surface defects in disk memories or tape storage devices, or may be derived from atmospheric transmission of data or long line transfers thereof. Fire Codes are in the family or cyclic codes and provide simple-to-implement burst error correction utilizing the encoder and decoder circuitry described above. (Reference: Phillip Fire, *A Class of Multiple-Error-Correcting Binary Codes for Non-Independent Errors*; Sylvania report RSL-E-II, Sylvania, Reconnaissance Systems Laboratory, Mountain View, Calif., 1959.) The discussion herein will assume the use of a Fire Code.

In FIG. 4 the internal features of EDAC system 2 of FIG. 1 are set forth. The binary word I(x) is input to EDAC system 2 from the data source through interface 10. In addition to supplying the necessary interfernce between the data source and EDAC system 2, interface 10 provides the means for partitioning the data fields of the incoming word I(x). The odd positioned data bits of I(x) are fed to EDAC encoder 11, while the even position bits are input to EDAC encoder 12. Following the generation of the code check bits in each encoder, 11 and 12, the odd and even coded data bits are reassembled by interleaving within interface 13 and output as the code word F(x) to the storage or transmission device associated with EDAC system 2. The partitioning and interleaving of data fields is well known in the prior art. Such partitioning is often done when the data transfer rate exceeds the available clock rate of the EDAC hardware. However, for the purposes of the teachings herein, the fields are partitioned and separately encoded for purposes of reducing of miscorrection errors to de minimus levels.

One of the criteria for selecting a code generator polynomial, g(x), is the establishment of the bounds of the error detection capability of the EDAC system. When it is said that a system will detect errors of length sixteen bits or less, it is meant that it will detect 100% of such errors without casing a miscorrection. In practice, such a system may be capable of detecting errors of three, or four, or more times greater length. However, in such cases, the possibility of miscorrection exists. In establishing the 100% detection-without-miscorrection bound, the designer does so based on the statistical probability that burst errors of such length are highly improbable. Thus, run-of-the-mill errors will always be detected without miscorrection. Nevertheless, it is an awareness of the atypical error burst which frequently causes the EDAC system designer to over-design the system circuitry and provide complex encoders and decoders which produce error code check bits far in excess of that which may be efficiently utilized by the overall system.

By partitioning the data field bits, the teachings herein provide for an error detection and correction system of less complexity which makes more efficient use of storage capacity and conserves processing time in the devices associated with the EDAC system. For example, in the system under discussion the practitioner of the prior art might well be tempted to design an EDAC system capable of 100% detection-without-miscorrection of error bursts in excess of sixteen bits in order to avoid miscorrection of the atypical burst error. As will be seen, such over-design is not required with the present invention.

Referring again to FIG 4, coded data enters interface 14 as the word H(x). The word H(x) may be considered to comprise the original coded information, F(x), plus an error, E(x). Interface 14 provides a direct output to buffer register 15 and a partitioned output to even-bit-position decoder 16 and to odd-bit-position decoder 17. Buffer register 15 is implemented to serve the purpose described with respect to buffer register 7 in the discussion of FIG. 3A, except here, buffer 15 services both decoders 16 and 17. While decoders 16 and 17 are acting to derive an error syndrome on the partitioned field data provided to each, the even and odd bit information is being made available, on lines 18 and 19 respectively, to their respective correction logic blocks, 20 and 21. The odd field bits are output on line 23 from correction logic block 21, while the even partitioned bits are output on line 22 from correction logic block 20. Lines 22 and 23 provide the inputs to interface 24, wherein the even and odd bit information is interleaved and output to the User Device.

In the course of the operations just described, word H(x) is preserved in buffer register 15, although the input word H(x) is made immediately available to the User Device. This latter arrangement provides the User Device with immediate access to the input word, H(x), so that there need be no delay in utilizing the data if the error term, E(x), is equal to zero. Should either or both of decoders 16 and 17 detect an error in input word H(x), the User Device will be altered and instructed to ignore the erroneous input and await receipt of the corrected information.

As the data are output from correction logic block 21 along line 23, they are subjected to CRC check 25. Check circuit 25 provides a backup for the EDAC decoder and provides a self-check of the EDAC system itself including buffer 15. CRC check circuitry 26 serves identical purposes with respect to the even position bit data on line 22.

In addition, as previously mentioned, it is assumed that the storage and transmission devices, as well as all other user devices associated with the EDAC system, will provide for parity and CRC checks of the data input to such devices. Failure to pass a parity or a CRC check will cause a fault indication and require a retransmission of the data word.

Should either decoder 16 or 17 detect an error, the User Device will be immediately notified and the EDAC system will go into the error correction mode. If the error syndrome derived in the decoder indicates a correctable error, the operation will be in accord with that previously set forth in the description accompanying FIG. 3B. The output of buffer register 15 and the correction code output from decoder 16 or 17 will be combined within their respective logic circuitry, 20 or 21, and the corrected word will output on lines 22 or 23, respectively.

If the error syndrome derived indicates that the fault is not correctable, correction logic circuitry, 20 or 21, will indicate a fault, and a restransmission of data word H(x) will be initiated. If correctable, CRC checks 25 and 26 are performed on the corrected word as previously indicated and the corrected data are interleaved in interface 24 and output to the User Device.

In a conventional EDAC system capable of correcting burst errors of length four and of detecting-without-miscorrection burst errors of length sixteen, it is likely that a Fire Code polynomial of degree forty-eight might be utilized. This would require the use of linear feedback shift registers having forty-eight flip flops. By partitioning the data into even and odd field bits, it is possible to use encoder and decoder circuitry designed around a Fire Code generator polynomial, g(x), of degree twenty-four, requiring only twenty-four flip flops in the associated linear feedback shift registers. Further, while the probability of making a miscorrection with the non-partitioned prior art system would, in all likelihood, be much less than unity, the probability of miscorrecting in a partitioned system is approximately the square of the miscorrection probability of the older, non-partitioned EDAC system, thus reducing that probability drastically. With the partitioned EDAC system taught here, both decoders must output acceptable code words upon receipt of non-correctable error data to effect a miscorrection. The probability of doing so with dual decoder systems is virtually nil. It is thus seen that partitioning the fields within the EDAC system results in the need for less complicated encoder and decoder circuitry, and greatly reduces the probability of making a miscorrection.

It may be further noted that, although reference has been repeatedly made to CRC checks being performed within the EDAC system, as well as at the various devices associated with that system, there has been no indication made in the discussion herein, nor in the associated drawings, of any CRC encoder devices. In prior art systems it was necessary to provide separate encoder circuitry to allow the performance of CRC checks. The code word required EDAC check bits plus additional CRC check bits. Th present system obviates the need for CRC encoder circuitry, as well as eliminating the need for extending the length of code word and expending the time and storage capacity to handle such an extended code word.

In FIG. 4, the notation, g(x), will be found alongside encoders 11 and 12 and decoders 16 and 17. This indicates that all these devices are related by their use of the same Fire Code generator polynomial, g(x). The relationship of the CRC check circuits, 27 and 28 is indicated by the notation: f[g(x)]. This notation indicates that the code used for the CRC check is a factor of code polynomial g(x) used to generate the Fire Code check bits. It is a characteristic of cyclic codes, of which the Fire Codes represent one example, that polynomials which are factors of the selected generator code polynomial are themselves legitimate code polynomials. Thus, if a cyclic redundancy code (CRC) polynomial is selected, which CRC code polynomial is a factor of the selected Fire Code polynomial, a CRC check may be successfully performed on code words encoded by the use of the Fire Code generator polynomial alone. To illustrate the applicability of this concept assume that a Fire Code generator polynomial, $$g(x) = (X^{15} + X^{14} + X^{13} + X^{12} + X^{11} + X^3 X^2 X + 1)(X^9 + 1),$$

is selected for use in the EDAC system of FIG. 4. It may be easily shown that this expression may be rewritten as:

$$g(x) = (X^8 + X^7 + X^6 + X^5 + X^4 + X^3 + X + 1)(X^{16} + X^{11} + X^4 + 1).$$

The indicated additions are performed modulo two. Referral to the previously referenced Peterson text will show that g(x), as first written above, it a recognized Fire Code, while the expression in the rightmost parenthesis of the second writing of g(x) above is a recognized CRC code. Thus, the particular g(x) indicated may be used to provide the EDAC Fire Codes as well as the means necessary to perform a CRC check.

The illustration above exemplifies good design techniques in practicing the methodology espoused herein, since the particular CRC polynomial, $X^{16} + X^{11} + X^4 + 1$, is specifically available for implementation using a commercial integrated circuitry chip, MC8503, manufactured by Motorola Inc. Because many of the devices associated with the EDAC system will employ buffer registers at their input, the simple addition of one such IC chip at the input to the device will provide the means for performing a CRC check of the incoming data. The encoder and decoder for use with the Fire Code itself may be implemented using Motorola Inc. circuits such as their MC8504P.

The invention herein disclosed teaches that partitioning the fields of an incoming data word may be utilized in an error detection and correction system to drastically reduce the probability of making a miscorrection in the received dat word, H(x). The method advocates the use of cyclic codes for error detection and correction which have as a factor of the code generator polynomial a CRC code polynomial such that no additional encoding circuitry is required to permit the performance of CRC checks on the coded data words.

The example has been here given in terms of odd-/even partitioning but is should be remembered that other partitioning schemes may be used to advantage, e.g. partitioning every third or fourth bit and using three or four encoders and decoders would further enhance the system's ability to avoid miscorrection.

The embodiment disclosed provides the means for a simple maintenance test check of the system. If a test code word is made up of sets of paired ones and paired zeroes, each partitioned field will be identical. Comparison of the fields and identification of problems is then relatively simple.

Apparatus has been set forth as a practical example of the result of practicing the methods herein taught. It will be obvious to those skilled in the art that various chanes and modifictions may be made in the embodiment disclosed without departing from the invention. For example, the partitioned fields may be coded and then transmitted to the decoder without transiting the intermediate interleaving and repartitioning apparatus disclosed in the embodiment herein discussed. It is therefore intended to cover herein all such changes and modifictions as fall within the true spirit and scope of the invention.

Having thus described our invention, that which we claim as new and desire to secure by Letters Patent of the United States is:

We claim:

1. A method for increasing the utility of coded check bits and reducing the probability of miscorrecting non-correctable error data in an error detection and correction system in which a coded data word made up of information bits and coded check bits is used to implement error detection and correction as well as to perform a cyclical redundancy code check for supplementary error detection comprising the steps of:

(a) partitioning a data word into at least two fields;
(b) encoding each of said partitioned fields with coded check bits derived in accordance with selected cyclic (EDAC) code generator polynomial g(x);
(c) decoding each of said coded partitioned fields in accordance with said selected EDAC code polynomial g(x) to provide an error syndrome for error detection and correction purposes;
(d) further decoding each of said coded partitoned fields in accordance with a cyclic redundancy code (CRC) generator polynomial f selected to be a factor of said EDAC code polynomial g(x) for purposes of supplementary error detection of said coded partitioned field;
(e) interleaving said decoded partitioned fields, corrected as necessary, to reproduce said data word;

whereby said coded check bits generated in accordance with EDAC code polynomial g(x) are utilized for supplementary CRC error detection without the need to generate separate CRC check bits and the effect of said partitioning makes miscorrection of data a virtual impossibility.

2. A method for increasing the utility of coded check bits and reducing the probability of miscorrecting non-correctable error data in an error detection and correction system in which a coded data word made up of information bits and coded check bits is used to implement error detection and correction as well as to perform a cyclical redundancy code check for supplementary error detection comprising the steps of:

(a) partitioning a data word into at least two fields;
(b) encoding each of said partitioned fields with coded check bits derived in accordance with selected cyclic (EDAC) code generator polynomial g(x);
(c) interleaving said partitioned fields, encoded as aforesaid, to produce a coded data word;
(d) partitioning said coded data word into at least two fields as done in (a) above and decoding each of said coded partitioned fields in accordance with said selected EDAC code polynomial g(x) to provide an error syndrome for error detection and correction purposes;
(e) further decoding each of said coded partitioned fields in accordance with a cyclic redundancy code (CRC) generator polynomial f selected to be a factor of said EDAC code polynomial g(x) for purposes of supplementary error detection of said coded partitioned field;
(f) interleaving said decoded partitioned fields, corrected as necessary, to reproduce said data word;

whereby said coded check bits generated in accordance with EDAC code polynomial g(x) are utilized for supplementary CRC error detection without the need to generate separate CRC check bits and the effect of said partitioning makes miscorrection of data a virtual impossibility.

3. In an error detection and correction system means for reducing the probability of miscorrecting non-correctable error data and for utilizing error detection and correction code check bits for supplementary cyclic redundancy error detection without generating separate cyclic redundancy code check bits comprising:

(a) first partitioning means operative to partition a data work into at least two fields;

(b) encoding means operative to encode each of said partitioned fields with coded check bits derived in accordance with selected cyclic error detection and correction (EDAC) code generator polynomial g(x);

(c) first decoding means to accept the coded partitioned fields from said encoding means and to decode each of said coded partitioned fields in accordance with said selected EDAC code polynomial g(x) to provide an error syndrome for error detection and correction purposes;

(d) correction means operative to evaluate said error syndrome, detect errors and correct same;

(e) second decoding means to further decode said coded partitioned fields in accordance with a cyclic redundancy code (CRC) generator polynominal f selected to be a factor of EDAC code polynomial g(x) for purposes of supplementary error detection of said coded partitioned field;

(f) interleaving means operative to accept said partitioned fields as decoded and corrected and to interleave same to reproduce said data word.

4. In an error detection and correction system means for reducing the probability of miscorrecting non-correctable error data and for utilizing error detection and correction code check bits for supplementary cyclic redundancy error detection without generating separate cyclic redundancy code check bits comprising:

(a) first partitioning means operative to partition a data word into at least two fields;

(b) encoding means operative to encode each of said partitioned fields with coded check bits derived in accordance with selected cyclic error detection and correction (EDAC) code generator polynomial g(x);

(c) first interleaving means for interleaving the encoded partitioned fields output by said encoding means so as to produce a coded date word;

(d) second partitioning means to partition said coded data word into at least two fields as done by said first partitioning means;

(e) first decoding means to accept the coded partitioned fields from said second parititioning means and to decode each of said coded partitioned fields in accordance with said selected EDAC code polynomial g(x) to provide a error syndrome for error detection and correction purposes;

(f) correction means operative to evaluate said error syndrome, detect errors to correct same;

(g) second decoding means to further decode said coded partitioned fields in accordance with a cyclic redundancy code (CRC) generator polynomial f selected to be a factor of EDAC code polynomial g(x) for purposes of supplementary error detection of said coded partitioned field;

(h) second interleaving means operative to accept said partitioned fields as decoded and corrected and to interleave same to reproduce said data word.

5. A method for increasing the utility of coded check bits in an error detection and correction system in which a coded data word made up in information bits and coded check bits is used to implement error detection and correction as well as to perform a cyclical redundancy code check for supplementary error detection comprising the steps of:

(a) encoding data words with coded check bits derived in accordance with selected cyclic error detection and correction (EDAC) code generator polynomial, g (x);

(b) decoding said encoded data words in accordance with said selected EDAC code polynomial g(x) to provide an error syndrome for error detection and correction purposes;

(c) further decoding said encoded data words in accordance with a cyclic redundancy code (CRC) generator polynomial f selected to be a factor of said EDAC code polynomial g(x) for purposes of supplementary error detection of said encoded data word;

whereby said coded check bit generated in accordance with EDAC code polynomial g(x) are utilized for both errordetection-and-correction and supplementary CRC error detection.

6. In an error detection and correction system means for utilizing error detection and correction code check bits for supplementary cyclic redundancy error detection checks without generating separate cyclic redundancy code check bits comprising:

(a) encoding means coperative to encode data words with coded check bits derived in accordance with selected cyclic error detection and correction (EDAC) code polynomial g(x);

(b) first decoding means operative to accept data words encoded by said encoding means and to decode said encoded data words in accordance with said selected EDAC code polynomial g(x) to provide an error syndrome for error detection and correction purposes;

(c) correction means for evaluating said error syndrome, detecting errors and correcting same.

(d) second decoding means to further decode said encoded data words and provide supplementary error detection said second decoding means being operative in accordance with a cyclic redundancy code (CRC) generator polynomial f selected to be a factor of said EDAC code polynomial g.

7. A method for reducing the probability of miscorrecting non-correctable error data in an error detection and correction system comprising the steps:

(a) partitioning a data word into at least two fields;

(b) encoding each partitioned field in accordance with a selected EDAC code generator polynomial;

(c) decoding each of said partitioned fields in accordance with said selected EDAC code polynomial to provide an error syndrome for error detection and correction purposes;

(d) interleaving said decoded partitioned fields, corrected as dictated by said error syndrome, to reproduce said data word;

whereby the effect of encoding and decoding partitioned fields makes miscorrection of data substantially impossible.

8. A method for reducing the probability of miscorrecting non-correctable error data in an error detection and correction system comprising the steps of:

(a) partitioning a data word into at least two fields;

(b) encoding each partitioned field in accordance with a selected EDAC code generator polynomial;

(c) interleaving said partitioned fields, encoded as aforesaid, to produce a coded data word;

(d) partitioning each coded data word into at least two fields as done in (a) above and decoding each of said partitioned fields in accordance with said selected EDAC code polynomial to provide an error syndrome for error detection and correction purposes;

(e) interleaving said decoded partitioned fields, corrected as necessary, to reproduce said data word;

whereby the effect of encoding and decoding partitioned fields makes miscorrection of data substantially impossible.

9. In an error detection and correction system means for reducing the probability of miscorrection of noncorrectable error data comprising:

(a) partitioning menas for partitioning a data word into at least two fields for purposes of reducing the probability of miscorrection within the error detection and correction (EDAC) system;

(b) encoding means operative to encode each of said partitioned fields in accordance with a selected EDAC code generator polynomial;

(c) decoding means operative to accept the coded partitioned fields from said encoding means and to decode each of said coded partitioned fields in accordance with said selected EDAC code polynomial to provide an error syndrome for error detection and correction purposes.

(d) correction means operative to evaluate said error syndrome, detect errors and correct same;

(e) interleaving means operative to accept said partitioned fields as decoded and corrected and to interleave same to reproduce said data word.

10. In an error detection and correction system means for reducing the probability of miscorrection of noncorrectable error data comprising:

(a) first partitioning means for partitioning a data word into at least two fields for purposes of reducing the probability of miscorrection within the error detection and correction (EDAC) system;

(b) encoding means operative to encode each of said partitioned fields in accordance with a selected EDAC code generator polynomial;

(c) first interleaving means for interleaving the encoded partitioned fields output by said encoding means so as to produce a coded data word;

(d) second partitionig means operative to partition said coded data word into at least two fields as done by said first partitioning means;

(e) decoding means operative to accept the coded partitioned fields from said second partitioning means and to decode each of said coded partitioned fields in accordance with said selected EDAC code polynomial to provide an error syndrome for error detection and correction purposes, (f) correction means operative to evaluate said error syndrome, detect errors and correct same;

(g) second interleaving means operative to accept said partitioned fields as decoded and corrected and to interleave same to reproduce said data word.

* * * * *